United States Patent [19]
Pierro et al.

[11] Patent Number: 5,614,863
[45] Date of Patent: Mar. 25, 1997

[54] METHOD AND SYSTEM FOR INCREASING THE POWER EFFICIENCY OF A BALANCED AMPLIFIER/ANTENNA COMBINATION

[75] Inventors: John A. Pierro, East Meadow; Richard L. Clouse, Jr., Huntington; Ronald Rudish, Commack, all of N.Y.

[73] Assignee: AIL Systems, Inc., Deer Park, N.Y.

[21] Appl. No.: 550,948

[22] Filed: Oct. 31, 1995

[51] Int. Cl.$^6$ .......................................... H03F 3/24
[52] U.S. Cl. ............................ 330/1 R; 330/55; 330/276; 330/286; 330/306
[58] Field of Search .................... 330/1 R, 55, 276, 330/286, 306; 343/701

[56] References Cited

U.S. PATENT DOCUMENTS

| | | | |
|---|---|---|---|
| 3,821,655 | 6/1974 | Fisher | 330/276 |
| 4,097,814 | 6/1978 | Cohn | 330/276 X |
| 4,490,668 | 12/1984 | Sterzer | 343/708 X |
| 5,274,341 | 12/1993 | Sekine et al. | 330/306 X |

*Primary Examiner*—James B. Mullins
*Attorney, Agent, or Firm*—Hoffmann & Baron

[57] ABSTRACT

A system for increasing the power efficiency of a balanced amplifier driven antenna arrangement includes a push-pull class B power amplifier circuit which is responsive to a periodic, time varying input signal and generates at least two output signals in response thereto. The arrangement also includes a balanced antenna exhibiting a relatively high impedance at the second harmonic of the input signal. The arrangement further includes at least one transmission line operatively coupled between the power amplifier circuit and the balanced antenna to provide the at least two output signals to the balanced antenna. The at least one transmission line has a length which is one-eighth of the wavelength of the input signal or odd multiples thereof, and thereby reflects back to the power amplifier circuit a substantially short circuit at the second harmonic of the input signal.

10 Claims, 2 Drawing Sheets

METHOD AND SYSTEM FOR INCREASING THE POWER EFFICIENCY OF A BALANCED AMPLIFIER/ANTENNA COMBINATION

BACKGROUND OF THE INVENTION

1. Field of the Invention

The present invention relates to the operation of balanced antennas driven by balanced amplifiers, and more particularly relates to methods and systems for increasing output power efficiency of balanced amplifier/antenna combinations.

2. Description of the Prior Art

The use of class B power amplifiers, in a push-pull balanced configuration, to amplify a radio frequency (RF) signal, prior to the signal being transmitted into free space via an antenna, is well known in the prior art. Class B power amplifiers, whose output signal is a linear function of the input signal over 50 percent (180 degrees) of the input wave, offer the potential for very high power efficiency. It is also well known that this power efficiency, defined as the ratio of the amplifier RF output power to the amplifier dc input power, may reach a theoretical limit of 78.5 percent. Power amplifiers designed using metal semiconductor field effect transistors (MESFETs), high electron mobility transistors (HEMTs) or bipolar junction transistors (BJTs) may provide such theoretical efficiency.

However, due to the inherent non-linearities of these transistor devices, the output signal of a class B power amplifier suffers from significant harmonic distortion. This distortion takes the form of harmonic components, these components being present in the output voltage and current signals associated with the transistor devices. Class B push-pull operation seeks to eliminate these unwanted harmonic frequency components, particularly second harmonic load voltages, by summing them out of phase in order that they may cancel one another. In a conventional class B push-pull amplifier, this cancelling effect is accomplished by using a 180 degree output combiner wherein the second harmonic load voltages of each of the power transistors are summed and thus eliminated.

It is to be noted that if second harmonic load voltages generated by the push-pull class B power amplifiers are not properly terminated, this can result in the amplifier efficiency being degraded, thereby limiting the maximum level of efficiency to approximately 64 percent. Further, while the output combiner eliminates second harmonic components, the output combiner is also the source of significant dissipative power loss. Particularly, at microwave frequencies, the presence of the output combiner is responsible for degrading the amplifier efficiency by as much as 25 percent, thus limiting the ultimate power efficiency of the amplifier to approximately 59 percent. Accordingly, such power efficiency degradation, combined with this loss associated with the output combiner, can result in dropping the ultimate power efficiency of the amplification stage below 50 percent.

In addition, conventional systems for driving antennas also include several other necessary components. For instance, an impedance matching network is often required between the push-pull class B power amplifiers and the output combiner in order to match impedances of the amplifiers and the combiner. Further, a balun must often be used to convert the unbalanced feed coming from the output combiner into a balanced load such as is associated with a balanced antenna. Still further, the conventional systems may include additional harmonic filtering in the form of a harmonic filter placed between the output combiner and the balun. However, disadvantageously, all of these components have some degree of inherent dissipative power loss associated with them. Therefore, while they are necessary components in the conventional system, they also serve to degrade the high power efficiency level offered by the push-pull class B power amplifiers.

Accordingly, there is a need for a system and method which increases the power efficiency of a balanced amplifier/antenna combination by eliminating the dissipative power losses, as well as other sources of efficiency degradation, associated with the abovedescribed conventional arrangement.

OBJECTS AND SUMMARY OF THE INVENTION

It is an object of the present invention to provide a system for, and method of, increasing the power efficiency of a balanced amplifier/antenna combination.

It is another object of the present invention to provide a system for, and method of, increasing the power efficiency of a balanced amplifier/antenna combination by integrating a push-pull class B power amplifier directly with a balanced antenna, and at the same time achieving proper harmonic termination.

It is yet another object of the present invention to provide a system and method which is adapted to eliminate the dissipative power loss associated with the 180 degree output combiner used in the conventional power amplifier/antenna system configuration.

It is a further object of the present invention to provide a system and method which is adapted to eliminate the dissipative power loss associated with the impedance matching network used in the conventional power amplifier/antenna system configuration.

It is still a further object of the present invention to provide a system and method which is adapted to eliminate the dissipative power loss associated with the balun used in the conventional power amplifier/antenna system configuration.

In accordance with one form of the present invention, a system for increasing the power efficiency of a balanced amplifier/antenna combination, where the system is responsive to an RF signal, includes an RF signal splitter. The RF signal splitter is responsive to the RF signal and generates a first split RF signal and a second split RF signal, the second split RF signal being 180 degrees out of phase with the first split RF signal.

The system also includes a power amplifier circuit. The power amplifier circuit is responsive to the first split RF signal and the second split RF signal and amplifies each of the first and second split RF signals. The power amplifier circuit then respectively generates a first amplified RF signal and a second amplified RF signal, each of the first and second amplified RF signals having fundamental frequency components and predominantly second harmonic frequency components. The fundamental frequency components of the first amplified RF signal are 180 degrees out of phase with the fundamental frequency components of the second amplified RF signal, while the second harmonic frequency components of the first amplified RF signal are in phase with the second harmonic frequency components of the second amplified RF signal.

Further, the system includes a balanced antenna. The antenna is responsive to the first amplified RF signal and the second amplified RF signal. The antenna presents a high impedance to the second harmonic frequency components of each of the first and second amplified RF signals, and at the same time radiates the fundamental frequency components of each of the first and second amplified RF signals thereby allowing the fundamental frequency components of the first amplified RF signal to be combined, in free space, with the fundamental frequency components of the second amplified RF signal. Thus, a single transmitted RF signal is generated.

Still further, the system includes a transmission line. The transmission line is operatively coupled between the power amplifier circuit and the antenna. The transmission line receives and transmits the first amplified RF signal and the second amplified RF signal. The transmission line has a length which is selected to effectively present a substantially short circuit at the amplifier outputs to the second harmonic frequency components of each of the first and second amplified RF signals and thereby eliminate the second harmonic frequency components of each of the first and second amplified RF signals.

The RF signal, introduced to the system formed in accordance with the present invention, is preferably within a frequency range of between about 3 MHz and about 300 GHz. In addition, the power amplifier circuit utilized in the system formed in accordance with the present invention preferably includes class B power amplifiers in a push-pull configuration. Further, the length of the transmission line utilized in the system formed in accordance with the present invention is preferably equal to approximately one-eighth of the wavelength of the RF signal, or odd multiples thereof (i.e., ⅜ λ, ⅝ λ, etc.). Still further, a system formed in accordance with the present invention, preferably includes an impedance matching network. The network is operatively coupled between the RF signal splitter and the power amplifier circuit, thus providing impedance matching between the RF signal splitter and the power amplifier circuit.

In accordance with another form of the present invention, an amplifier driven antenna arrangement includes a push-pull class B power amplifier circuit. The power amplifier circuit is responsive to a periodic, time varying input signal and generates at least two output signals in response thereto. The system also includes a balanced antenna having a relatively high impedance at the second harmonic of the input signal. The system further includes at least one transmission line operatively coupled between the power amplifier circuit and the balanced antenna. The transmission line provides the at least two output signals to the balanced antenna. Further, the transmission line has a length which is approximately one-eighth of the wavelength of the input signal or odd multiples thereof, and thereby reflects back to the power amplifier circuit a substantially short circuit at the second harmonic of the input signal.

In a method according to one form of the present invention, the power efficiency of a balanced amplifier/antenna combination is increased by splitting an RF signal and thereby generating a first split RF signal and a second split RF signal. The second split RF signal is 180 degrees out of phase with the first split RF signal. The method also includes amplifying the first split RF signal and the second split RF signal and respectively generating a first amplified RF signal and a second amplified RF signal, each of the first and second amplified RF signals having fundamental frequency components and second harmonic frequency components. The fundamental frequency components of the first amplified RF signal are 180 degrees out of phase with the fundamental frequency components of the second amplified RF signal, while the second harmonic frequency components of the first amplified RF signal are in phase with the second harmonic frequency components of the second amplified RF signal.

The method also includes phasing the antenna reflection to effectively present substantially a short circuit to the second harmonic frequency components of each of the first and second amplified RF signals, and thereby eliminate the second harmonic frequency components of each of the first and second amplified RF signals.

In a method according to another form of the present invention, a balanced antenna is directly driven with a push-pull class B amplifier circuit. The power amplifier circuit is provided with a periodic, time varying input signal. The method includes selecting a balanced antenna exhibiting a relatively low value of input resistance at the fundamental frequency of the input signal when driven by balanced excitation and exhibiting a relatively substantial reactance at the second harmonic frequency of the input signal when driven by unbalanced excitation. The method also includes coupling the balanced antenna to the power amplifier circuit with a transmission line having a length which is one-eighth of the wavelength of the input signal and odd multiples thereof, thereby reflecting back to the power amplifier circuit a substantially short circuit at the second harmonic of the input signal.

Previously, designs of systems for driving balanced antennas have often required such components as push-pull class B power amplifiers, impedance matching networks, output combiners, baluns and harmonic filters. While these components were necessary to attempt to drive the antenna with some degree of efficiency, certain of these components introduced inherent dissipative power loss into the system. Thus, in an attempt to limit harmonic distortion by suppressing unwanted harmonic frequency components, the prior art systems suffered from low power efficiency thereby degrading the performance of the amplifier/antenna combination.

Surprisingly, it has been discovered that a system for increasing the power efficiency of a balanced amplifier/antenna combination can employ push-pull class B power amplifiers integrated directly with a balanced antenna. By employing such a unique approach, a system formed in accordance with the present invention may be adapted to eliminate the dissipative power losses associated with the prior art components previously mentioned, and at the same time eliminate unwanted harmonic frequency components.

These and other objects, features and advantages of the present invention will become apparent from the following detailed description of illustrative embodiments thereof, which is to be read in connection with the accompanying drawings.

DETAILED DESCRIPTION OF THE PREFERRED EMBODIMENT

Figure 1:
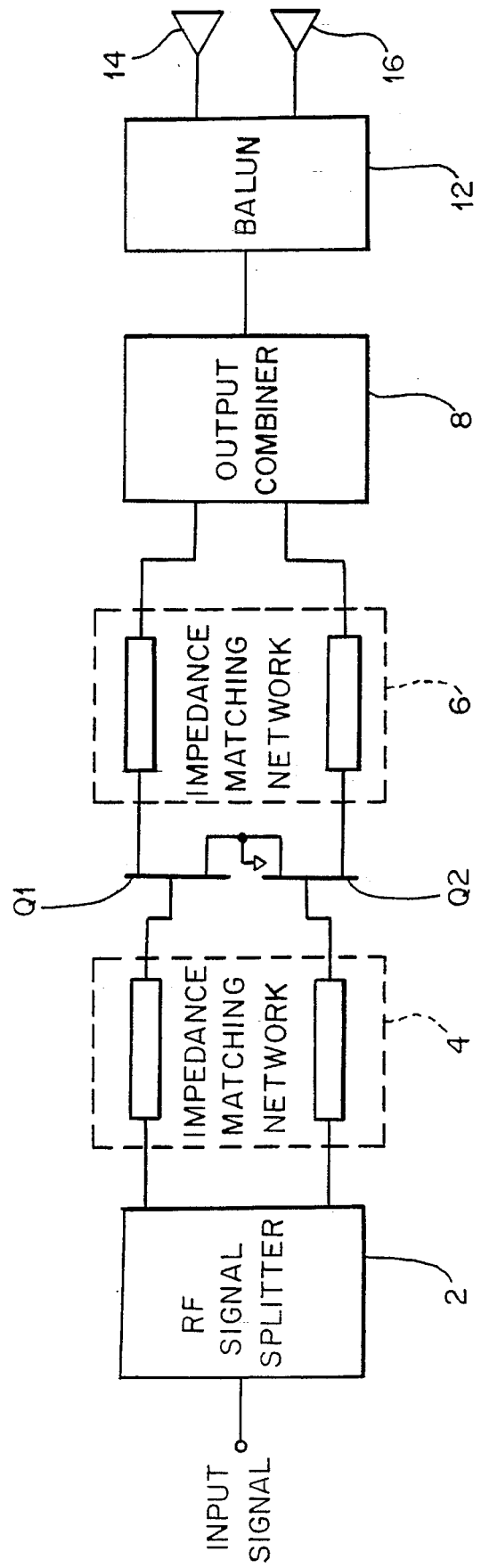
FIG. 1 is a functional block diagram of a conventional system for driving a balanced antenna via push-pull class B power amplifiers.

Referring initially to FIG. 1, a conventional arrangement of a push-pull class B power amplifier circuit driving a balanced antenna is illustrated. The conventional arrangement, well known in the prior art, includes an RF signal splitter 2, a first impedance matching network 4, push-pull class B power amplifiers (shown in this example as transistors Q1 and Q2), a second impedance matching network 6, a 180 degree output combiner 8, a balun 12, a first radiating element 14 and a second radiating element 16.

An RF signal, in the frequency range between about 3 MHz and about 300 GHz (HF band to EHF band), is introduced to the RF signal splitter 2. The RF signal splitter 2 includes an input port and first and second output ports. The RF signal splitter 2 receives the RF signal at its input port and, in response, equally splits the power associated with the RF signal thereby generating two separate RF signals, a first split RF signal and a second split RF signal, at the signal splitter's output ports respectively. The first and second split RF signals are 180 degrees out of phase with one another.

A first impedance matching network 4 is situated between the RF signal splitter 2 and the class B power amplifiers, Q1 and Q2. The first impedance matching network 4 is used to match the output impedance of the RF signal splitter 2 to the input impedance of the power amplifiers, Q1 and Q2. Impedance matching is traditionally accomplished by transformer coupling; however, other methods of matching known to persons skilled in the art may be employed.

The push-pull class B power amplifiers, Q1 and Q2, are operatively coupled to the RF signal splitter through the first impedance matching network 4. Power amplifiers Q1 and Q2 receive, at their respective bases (in the case of BJTs) or their respective gates (in the case of MESFETs), the first and second split RF signals. The power amplifiers then amplify the split RF signals, thereby respectively generating a first amplified RF signal and a second amplified RF signal at their respective collectors (in the case of BJTs) or respective drains (in the case of MESFETs). Like the first and second split RF signals, the first and second amplified RF signals are 180 degrees out of phase with one another.

As previously discussed, class B power amplifiers, such as transistors Q1 and Q2, have the potential for very high power efficiency. This power efficiency may reach a theoretical limit of 78.5 percent. MESFETs, HEMTs and BJTs are all capable of achieving this theoretical power efficiency limit. However, one key factor in achieving this limit is the condition that the saturation resistance associated with the class B power amplifiers is low in comparison to the resistance associated with the load connected to the respective collectors (or drains) of the power amplifiers.

Accordingly, as the ratio of the saturation resistance to the load resistance theoretically approaches a value of zero, and as the class B power amplifiers approach full signal swing (operating the amplifiers between the amplifiers' cutoff and saturation limits), the power efficiency approaches the theoretical limit of 78.5 percent. A detailed derivation of this well-known power efficiency limit associated with push-pull class B power amplifier operation is disclosed in the "Handbook of Semiconductor Electronics", 3d edition (1970), by Lloyd P. Hunter, pages 11–96 through 11–102, incorporated herein by reference.

However, because of inherent non-linearities associated with transistor devices such as MESFETs, HEMTs and BJTs, the output signal of a class B power amplifier exhibits significant harmonic distortion. This distortion results in appreciable harmonic components being present in the output signals of the amplifying devices. Unless this harmonic distortion can be minimized, if not eliminated, the power efficiency of the overall system is significantly degraded. In particular, second harmonic frequency components associated with the output signal of a class B power amplifier are of concern when attempting to maintain maximum system power efficiency.

Accordingly, in the conventional system illustrated in FIG. 1, both the first and second amplified RF signals, generated respectively by the class B power amplifiers, Q1 and Q2, contain fundamental frequency components and predominantly second harmonic frequency components. As is well established in push-pull class B power amplifier operation, the fundamental frequency components of the first amplified RF signal are 180 degrees out of phase with the fundamental frequency components of the second amplified RF signal, while the second harmonic frequency components of the first amplified RF signal are in phase with the second harmonic frequency components of the second amplified RF signal.

A second impedance matching network 6 is situated between the class B power amplifiers, Q1 and Q2, and the output combiner 8. As its name implies, the second impedance matching network 6 matches the output impedance of the class B amplifiers, Q1 and Q2, to the input impedance of the output combiner 8 and may be accomplished by conventional transformer coupling.

The output combiner 8 is operatively coupled to the class B power amplifiers, Q1 and Q2, through the second impedance matching network 6. The output combiner 8 has first and second input ports and an output port. The output combiner 8 respectively receives the first and second amplified RF signals at its first and second input ports and, in response, performs two functions. First, the output combiner 8 combines the fundamental frequency components of the first amplified RF signal with the fundamental frequency components of the second amplified RF signal, thereby generating a resulting combined RF signal. Second, the output combiner 8 combines the in phase second harmonic frequency components, for instance, the second harmonic load voltages generated by the class B power amplifiers, Q1 and Q2, and by summing these components out of phase, eliminates these unwanted harmonic components.

Still referring to the conventional arrangement illustrated in FIG. 1, a balun 12 is coupled to the output port of the output combiner 8 and receives the combined RF signal presented on the output port of the output combiner 8. The balun 12 provides the conversion between the unbalanced feed from the output combiner 8 and the balanced load, the balanced load being the balanced antenna consisting of the first radiating element 14 and the second radiating element 16. The balanced antenna then radiates the combined RF signal into free space.

Although not illustrated in FIG. 1, a harmonic filter may be situated between the output combiner 8 and the balun 12, in the conventional system, to further minimize harmonic distortion present in the combined RF signal.

While the conventional system, as illustrated in FIG. 1, serves the function of transmitting an RF signal, several system components necessary for the system's operation introduce significant dissipative power loss, thereby reducing the power efficiency associated with the amplifier/antenna combination. Particularly, at microwave frequencies, the output combiner 8 is capable of degrading the power efficiency of the class B power amplifiers, Q1 and Q2, by more than 1 dB. In terms of percent efficiency, this loss is equivalent to as much as 25 percent, thereby limiting the ultimate power efficiency of the amplifiers to approximately 59 percent. Further, second harmonic voltages generated by the class B power amplifiers, Q1 and Q2, if not properly terminated, can also result in a decrease in amplifier efficiency. Such unwanted harmonic components can degrade the maximum level of efficiency to approximately 64 percent.

As discussed previously, such efficiency degradation combined with the loss associated with the output combiner 8, can result in dropping the ultimate power efficiency of the amplifier, and thus the system, below 50 percent. Additionally, in the conventional system, further dissipative power loss is inherent in the second impedance matching network 6 (loss of approximately 3/10 dB) and in the balun 12 (loss of approximately 1/2 dB). These power losses are typical for a conventional system operating in the frequency range of between about 15 GHz to about 18 GHz.

The system of the present invention provides a vast improvement in system power efficiency over the conventional system illustrated in FIG. 1. The system of the present invention accomplishes this improvement by integrating the push-pull class B power amplifiers directly with a balanced antenna. By employing such a unique approach, a system formed in accordance with the present invention may be adapted to eliminate the dissipative power losses associated with the second impedance matching network 6, the output combiner 8, the balun 12, and any harmonic filter present in the conventional system.

Figure 2:
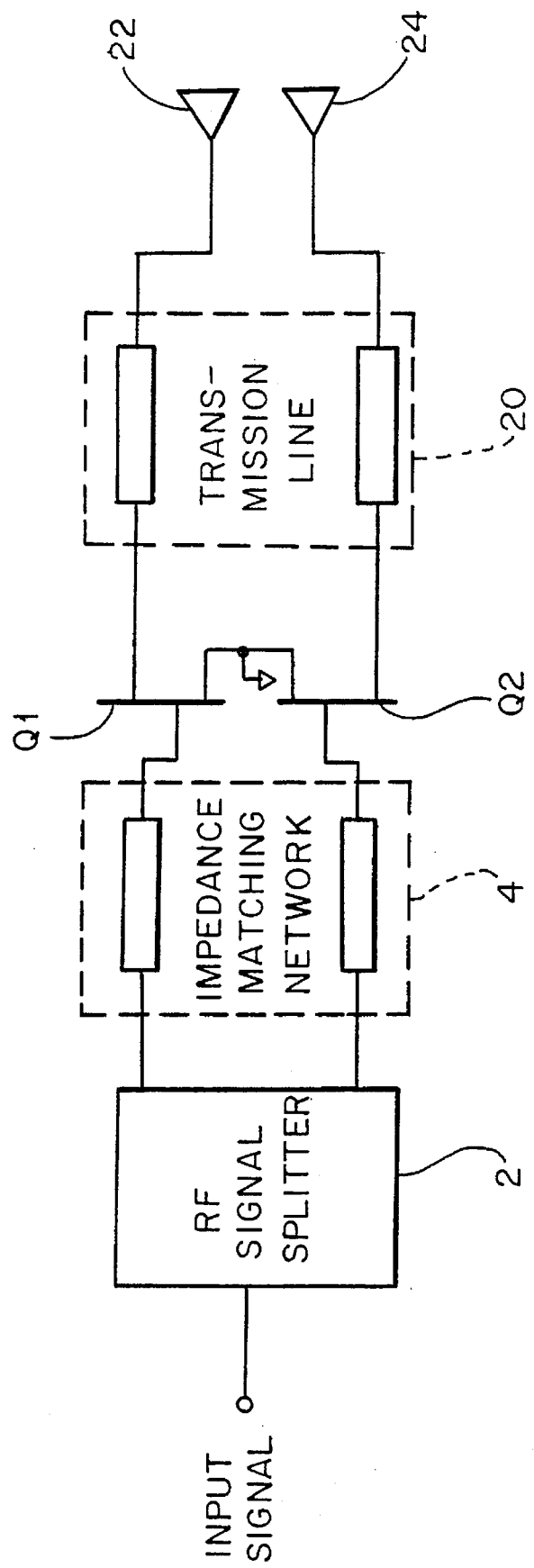
FIG. 2 is a functional block diagram of a system, formed in accordance with the present invention, for increasing the power efficiency of a balanced amplifier/antenna combination.

Referring now to FIG. 2, a system for increasing power efficiency of a balanced amplifier/antenna combination, formed in accordance with the present invention, is illustrated. The system of the present invention, in a preferred embodiment, includes an RF signal splitter 2, an impedance matching network 4, push-pull class B power amplifiers (shown in simplified form as transistors Q1 and Q2), a transmission line 20, a first radiating element 22 and a second radiating element 24. The radiating elements, 22 and 24, comprise the balanced antenna.

It is to be appreciated that the RF signal splitter 2, the impedance matching network 4 and the push-pull class B power amplifiers, Q1 and Q2, of the present invention are connected and function in exactly the same manner as previously described with respect to the conventional system. In other words, the system formed in accordance with the present invention is responsive to an RF signal in the preferred frequency range between about 3 MHz and about 300 GHz, the RF signal being introduced at the input port of the RF signal splitter 2. The RF signal splitter 2 is responsive to the RF signal and generates first and second split RF signals, the first and second split RF signals being 180 degrees out of phase with one another. The push-pull class B power amplifiers, Q1 and Q2, receive the first and second split RF signals, through the impedance matching network 4, and respectively generate first and second amplified RF signals, the first and second amplified RF signals having fundamental frequency components and second harmonic frequency components. The fundamental frequency components of the first amplified RF signal are 180 degrees out of phase with the fundamental frequency components of the second amplified RF signal, while the second harmonic frequency components of the first amplified RF signal are in phase with the second harmonic frequency components of the second amplified RF signal.

However, from the respective collectors (or drains) of the class B power amplifiers, Q1 and Q2, out through the antenna consisting of radiating elements 22 and 24, is where the system of the present invention parts ways and provides a vast improvement over the conventional system. Surprisingly, by directly integrating the push-pull class B power amplifiers, Q1 and Q2, with the balanced antenna, inserting transmission line 20, and properly choosing parameters for the balanced antenna, the present invention eliminates the dissipative power losses associated with the conventional system thereby allowing the amplifier/antenna combination of the present invention to more closely approach the desired theoretical power efficiency limit of 78.5 percent.

Accordingly, the system of the present invention improves the power efficiency of a balanced amplifer/antenna combination in the following manner. The balanced antenna of the present invention is chosen such that it exhibits a relatively low value of input resistance (tens, rather than hundreds of ohms) at the fundamental frequency when driven with odd mode, or balanced, excitation. Further, the balanced antenna of the present invention is chosen such that it exhibits substantial reactance at the second harmonic frequency when driven with even mode, or unbalanced, excitation. Thus, the balanced antenna operates at maximum efficiency when driven by RF signals having respective fundamental frequency components which are 180 degrees out of phase with one another. Conversely, the balanced antenna operates at minimum efficiency when driven by RF signals having respective second harmonic frequency components which are in phase with one another.

The effect of the balanced antenna exhibiting substantial reactance at the second harmonic frequency is that second harmonic frequency components are effectively presented with a substantially open circuit at the junction between the transmission line and the balanced antenna. This open circuit serves to reflect the second harmonic components back through the transmission line. Thus, by choosing a transmission line with a particular length in relation to the wavelength of the input RF signal, the reflected second harmonic components will be presented with a short circuit at the junction between the transmission line and the power amplifiers. Advantageously, the short circuit will serve to eliminate the second harmonic components of the RF signals. It is to be appreciated that the procedure of choosing proper antenna impedance parameters, and inserting a transmission line having proper characteristics, in order to produce this effect, is herein referred to as phasing the balanced antenna reflection.

It is also to be appreciated that several balanced antennas, within the family of elementary radiators which exhibit the impedance characteristics discussed above, may be employed in the system of the present invention. For instance, in one embodiment of the present invention, the balanced antenna is a half wavelength dipole antenna which is composed of two equal length radiating elements (the dipole arms) that are colinearly arrayed. Particularly, the input impedance of the half wavelength dipole antenna backed by a ground-plane reflector can be tailored by choice of the dipole arm length and choice of the spacing between the dipole and the ground-plane reflector. Thus, in order to maximize the efficiency of the antenna at the fundamental frequency, and at the same time suppress second harmonic frequency components, the dipole reactance can be tailored by choice of dipole arm length after the dipole resistance is lowered by choice of spacing between the dipole and the ground-plane reflector. It is to be appreciated that dipole arm length primarily affects dipole reactance while choice of spacing between the dipole and the ground-plane reflector affects both resistance and reactance.

However, a half wavelength dipole antenna is only one antenna in a family of elementary radiators which exhibit a relatively low value of input impedance at the fundamental frequency when driven in odd mode excitation and substantial reactance at the second harmonic frequency when driven in even mode excitation. Thus, further embodiments of the present invention may include, but are not limited to, such balanced antennas as an Alford loop antenna, a folded slot antenna, or an offset fed slot antenna. It is to be understood that other antennas having similar impedance characteristics known to persons skilled in the art may be employed in the present invention.

Thus, in accordance with the present invention as illustrated in FIG. 2, push-pull class B amplifiers, Q1 and Q2, respectively generate first and second amplified RF signals. As previously discussed, both signals have fundamental frequency components as well as second harmonic frequency components. The fundamental frequency components of the first amplified RF signal are 180 degrees out of phase with those of the second amplified RF signal, while the respective second harmonic frequency components of each of the first and second amplified RF signals are in phase.

Transmission line 20 is operatively coupled to the respective collectors (or drains) of the class B power amplifiers, Q1 and Q2. In a preferred embodiment, transmission line 20 has a length which is approximately one-eighth of the wavelength of the fundamental frequency. The length may also be approximately odd multiples of one-eighth, that is, $3/8$ $\lambda$, $5/8$ $\lambda$, and so on. Further, in a preferred embodiment, transmission line 20 is a twin-lead or ladder-type balanced transmission line. The fact that the transmission line 20 is balanced obviates the need for a balun to be situated between the transmission line 20 and the balanced antenna, as is required in the conventional system. The losses associated with a one-eighth wavelength transmission line are, of course, negligible, and yet suppression of second harmonics and direct coupling of the power amplifiers to the antenna through the transmission line are achieved by the present invention without an output combiner 8 and its associated losses.

As further illustrated in FIG. 2, the balanced antenna is operatively coupled to the transmission line 20. The transmission line 20 receives the first and second amplified RF signals from the power amplifiers, Q1 and Q2, and transmits the signals to the balanced antenna. The balanced antenna, illustrated as radiating elements 22 and 24, exhibits a relatively high impedance to the second harmonic frequency components of each of the first and second amplified RF signals, or in other words, substantially an open circuit at the junction between the antenna and the transmission line. Accordingly, the second harmonic components are reflected back through the transmission line 20. Since, in a preferred embodiment, the transmission line length is approximately one-eighth of the wavelength of the fundamental frequency, the reflected second harmonic components will be presented with substantially a short circuit at the junction between the transmission line and the respective collectors (or drains) of the class B power amplifiers, Q1 and Q2.

The short circuit occurs at the power amplifier/transmission line junction because, by choosing the transmission line length to be one-eighth of the fundamental frequency, the second harmonic components (having a frequency equal to twice the fundamental frequency) get reflected back over a transmission line which the second harmonic components effectively see as being a one-quarter wavelength transmission line, that is, effectively twice the length seen by the fundamental frequency components and, thus, the open circuit at the antenna appears as a short one-quarter wavelength (at the second harmonic) through the transmission line. In this manner, the second harmonic frequency components associated with the amplified RF signals are advantageously eliminated. Further, it is to be appreciated that any type of impedance inverter, having similar characteristics as the transmission line 20, may be employed in the system of the present invention.

Conversely, the balanced antenna exhibits a low impedance to the fundamental frequency components of each of the first and second amplified RF signals. Thus, the fundamental frequency components of each of the first and second amplified RF signals are radiated by the balanced antenna, into free space, where they are combined in proper phase into a single transmitted RF signal.

As is evident from the foregoing description, the system of the present invention increases the power efficiency of a balanced amplifier/antenna combination by eliminating the second impedance matching network, the output combiner, the balun and the harmonic filter of the conventional system, and thus, the dissipative power losses respectively associated with these components. This improvement is accomplished by integrating the push-pull class B power amplifiers directly with the balanced antenna, allowing the fundamental frequency components of the amplified RF signals to combine in proper phase, in free space, while advantageously suppressing the second harmonic components of the amplified RF signals. Thus, a system formed in accordance with the present invention is capable of approaching the theoretical power efficiency limit of 78.5 percent.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A system for increasing power efficiency of a balanced amplifier/antenna combination, the system being responsive to a radio frequency (RF) signal introduced thereto, the system comprising:

an RF signal splitter, the RF signal splitter being responsive to the RF signal, the RF signal splitter generating a first split RF signal and a second split RF signal, the second split RF signal being 180 degrees out of phase with the first split RF signal;

a power amplifier circuit, the power amplifier circuit being responsive to the first split RF signal and the second split RF signal, the power amplifier circuit amplifying each of the first and second split RF signals and respectively generating a first amplified RF signal and a second amplified RF signal, each of the first and second amplified RF signals having fundamental frequency components and second harmonic frequency components, the fundamental frequency components of the first amplified RF signal being 180 degrees out of phase with the fundamental frequency components of the second amplified RF signal, the second harmonic frequency components of the first amplified RF signal being in phase with the second harmonic frequency components of the second amplified RF signal;

a balanced antenna, the antenna being responsive to the first amplified RF signal and the second amplified RF signal, the antenna presenting a relatively high impedance to the second harmonic frequency components of each of the first and second amplified RF signals, the antenna radiating the fundamental frequency components of each of the first and second amplified RF signals thereby allowing the fundamental frequency components of the first amplified RF signal to be combined, in free space, with the fundamental frequency components of the second amplified RF signal, thereby generating a transmitted RF signal; and a transmission line, the transmission line being operatively coupled between the power amplifier circuit and the antenna, the transmission line receiving and transmitting the first amplified RF signal and the second amplified RF signal, the transmission line having a length, the length being selected to effectively present a substantially short circuit to the second harmonic frequency components of each of the first and second amplified RF signals and thereby eliminate the second harmonic frequency components of each of the first and second amplified RF signals.

2. A system as defined in claim 1, wherein the RF signal is within a frequency range of between about 3 MHz and about 300 GHz.

3. A system as defined in claim 1, wherein the power amplifier circuit includes class B power amplifiers in a push-pull configuration.

4. A system as defined in claim 1, wherein the length of the transmission line is one of one-eighth of the wavelength of the RF signal and an odd multiple thereof.

5. A system as defined in claim 1, further comprising an impedance matching network, the network being operatively coupled between the RF signal splitter and the power amplifier circuit, the network providing impedance matching between the RF signal splitter and the power amplifier circuit.

6. An amplifier driven antenna arrangement, which comprises:

a push-pull class B power amplifier circuit, the power amplifier circuit being responsive to a periodic, time varying input signal and generating at least two output signals in response thereto;

a balanced antenna exhibiting a relatively high impedance at the second harmonic of the input signal; and at least one transmission line operatively coupled between the power amplifier circuit and the balanced antenna to provide the at least two output signals to the balanced antenna, the at least one transmission line having a length which is one of one-eighth of the wavelength of the input signal and an odd multiple thereof, thereby reflecting back to the power amplifier circuit a substantially short circuit at the second harmonic of the input signal.

7. In combination:

a power amplifier circuit, the power amplifier circuit being responsive to an input signal and generating at least two output signals in response thereto;

a balanced antenna exhibiting a relatively high impedance at the second harmonic of the input signal; and an impedance inverter operatively coupled between the power amplifier circuit and the balanced antenna to provide the at least two output signals to the balanced antenna, the impedance inverter reflecting back to the power amplifier circuit a substantially short circuit at the second harmonic of the input signal.

8. A system for increasing power efficiency of a balanced amplifier/antenna combination, the system being responsive to an RF signal introduced thereto, the system comprising:

means for splitting the RF signal and thereby generating a first split RF signal and a second split RF signal, the second split RF signal being 180 degrees out of phase with the first split RF signal;

means for amplifying the first split RF signal and the second split RF signal and respectively generating a first amplified RF signal and a second amplified RF signal, each of the first and second amplified RF signals having fundamental frequency components and second harmonic frequency components, the fundamental frequency components of the first amplified RF signal being 180 degrees out of phase with the fundamental frequency components of the second amplified RF signal, the second harmonic frequency components of the first amplified RF signal being in phase with the second harmonic frequency components of the second amplified RF signal; and means for phasing an antenna reflection to effectively present substantially a short circuit to the second harmonic frequency components of each of the first and second amplified RF signals, and thereby eliminate the second harmonic frequency components of each of the first and second amplified RF signals.

9. A method of increasing power efficiency of a balanced amplifier/antenna combination, the method comprising the steps of:

splitting an RF signal and thereby generating a first split RF signal and a second split RF signal, the second split RF signal being 180 degrees out of phase with the first split RF signal;

amplifying the first split RF signal and the second split RF signal and respectively generating a first amplified RF signal and a second amplified RF signal, each of the first and second amplified RF signals having fundamental frequency components and second harmonic frequency components, the fundamental frequency components of the first amplified RF signal being 180 degrees out of phase with the fundamental frequency components of the second amplified RF signal, the second harmonic frequency components of the first amplified RF signal being in phase with the second harmonic frequency components of the second amplified RF signal; and phasing an antenna reflection to effectively present substantially a short circuit to the second harmonic frequency components of each of the first and second amplified RF signals, and thereby eliminate the second harmonic frequency components of each of the first and second amplified RF signals.

10. A method of directly driving a balanced antenna with a push-pull class B power amplifier circuit provided with a periodic, time varying input signal, which comprises the steps of:

selecting a balanced antenna exhibiting a relatively low value of input resistance at the fundamental frequency of the input signal when driven by balanced excitation and exhibiting a relatively substantial reactance at the second harmonic frequency of the input signal when driven by unbalanced excitation, the balanced antenna being driven by the push-pull class B power amplifier circuit; and coupling the balanced antenna to the power amplifier circuit with a transmission line having a length which is one of one-eighth of the wavelength of the input signal and an odd multiple thereof, thereby reflecting back to the power amplifier circuit a substantially short circuit at the second harmonic of the input signal.

* * * * *